AUTOMATIC GAIN CONTROL SYSTEM FOR CASCADED TRANSISTOR AMPLIFIER
Filed June 15, 1964
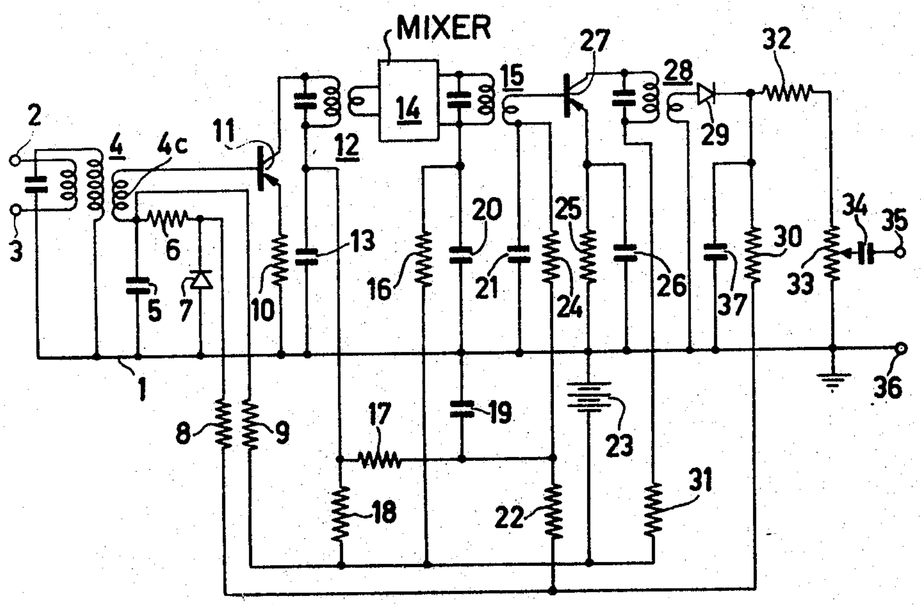
INVENTOR
EDUARD H. HUGENHOLTZ
BY
Frank R. Trifari
AGENT 3,328,714

AUTOMATIC GAIN CONTROL SYSTEM FOR CASCADED TRANSISTOR AMPLIFIER

Eduard H. Hugenholtz, Willowdale, Ontario, Canada, assignor to North American Philips Company, Inc., New York, N.Y., a corporation of Delaware
Filed June 15, 1964, Ser. No. 375,062
6 Claims. (Cl. 330—29)

This invention relates to an automatic gain control system of the type which includes a signal amplifier, first and second transistor amplifiers connected in amplifying cascade circuit arrangement, a signal amplitude detector to derive from the signal amplified by said casacade circuit a direct current voltage for automatic gain control purposes, means supplying said direct current voltage to said second transistor amplifier to control the gain thereof inversely with respect to the detected signal amplitude, means supplying said direct current voltage to said first transistor amplifier to control the gain thereof inversely with respect to the detected signal amplitude above a predetermined minimum of said signal amplitude, and delay means preventing application of said direct current voltage to said first transistor amplifier below said predetermined minimum.

In the control of the gain of an amplifier, regardless of whether it uses semi-conductors or vacuum tubes, at least two effects of the control must be taken account of. Decrease in gain of the controlled stage reduces the signal to noise ratio and increases the likelihood of cross- or inter-modulation due to the reduced signal-handling capability of the controlled stage.

The present invention takes cognizance of the defects of prior automatic gain control (A.G.C.) systems and reduces or substantially eliminates them.

In the above described amplifier, a cascaded transistorized amplifier is provided with first and second gain controlled stages wherein the gain of a second stage, with increasing signal strength, is reduced while the gain of a first stage of the amplifier is reduced only when the gain control voltage exceeds a predetermined amount. In other words, a delayed A.G.C. voltage is applied to the first controlled stage—the stages being numbered in ascending order from the input to the output of the amplifier.

The present invention has for its object to improve the noise figure and the signal handling capability of such amplifiers and the amplifier of the invention is therefore characterized in that D.C. conducting means are provided, which are connected to increase the gain of said second transistor amplifier with decreasing gain of said first amplifier. The reduction of gain of the first stage, which is effective to increase the gain of the second stage thus in effect produces an amplified A.G.C. system when the detected signal is greater than a predetermined minimum. This produces a greater value of A.G.C. voltage and finally current cut-off of the first stage which then acts only as a capacitive coupling which is free from noise and non-linear modulation effects. Thereafter, the gain of the amplifier is controlled in the second controlled stage.

The invention will now be described with reference to the single figure of the drawing showing a preferred application of the invention to a radio signal receiver.

In the drawing a radio-frequency signal, for instance from an antenna, is applied to input terminals 2, 3 and by means of coupling transformer 4 and capacitor 5 to the base-emitter circuit of a first transistor 11 which acts as the first controlled stage. The emitter of transistor 11 is connected by a resistor 10 to grounded conductor 1. The winding *4c* of transformer 4 is connected by a resistor 9 to a source of power, battery 23, negative with respect to conductor 1 and through a resistor 6 and a diode 7 to conductor 1. The junction of resistor 6 and diode 7 is connected through resistors 8 and 30 to the load circuit of a detector incorporating a diode 29. The collector electrode of transistor 11 is connected by the primary winding of a tuned transformer 12 and a resistor 18 to the negative terminal of battery 23. The resistor 18 is decoupled by a capacitor 13.

Transformer 12 feeds a mixer 14, shown in block form, which in turn feeds an intermediate frequency amplifier incorporating a transistor 27. The base electrode of transistor 27 is connected through the secondary winding of a tuned transformer 15, through resistors 24 and 22 to the A.G.C. line. The junction of the secondary winding and resistor 24 is decoupled for beat frequency oscillations by capacitor 21 connected between this junction and conductor 1. The junction of resistors 24 and 22 is decoupled by capacitor 19 and connected through resistor 17 to the collector side of resistor 18. In this manner the base voltage of transistor 27 is dependent on the collector current of transistor 11 and the voltage on the A.G.C. line.

The emitter electrode of transisor 27 is self-biased by the parallel circuit combination of resistor 25 and capacitor 26 connecting the emitter to conductor 1. The collector of transistor 27 is connected through the primary winding of tuned transformer 28 and resistor 31 to the negative terminal of battery 23. The secondary of transformer 28 supplies the intermediate signal, amplified by transistor 27, to a diode detector 29 having a load circuit including resistor 32 and output control potentiometer 33. The diode 29 detects any amplitude modulation appearing on the intermediate frequency oscillation and supplies it through a capacitor 34 to output terminals 35, 36. Capacitor 37 bypasses the radio frequencies, appearing across the detector load, to ground.

In the operation of the circuit described, when no signal is present, the operation point of transistor 27 is controlled by the collector current of transistor 11, i.e., the voltage drop across resistor 18, and for the condition considered transistor 27 will be biased below maximum gain. Transistor 11, the first stage, on the other hand is set for maximum gain and signal handling ability by the selection of resistors 9 and 6 to provide for a high signal to noise ratio and a minimum of intermodulation. The negative bias voltage supplied to the base electrode of transistor 11 is somewhat less than the voltage of battery 23 due to base current and also the current flow through diode 7 which is poled to conduct when a negative voltage is applied to the junction of resistors 6 and 8. A small current also flows through resistors 8, 30, the A.G.C. line and diode 29 to conductor 1.

When a radio frequency signal is received, amplified and detected, etc., a voltage positive with respect to conductor 1 is produced across the detector load and supplied to the A.G.C. line and through resistors 22, 24 to the base electrode of transistor 27 to reduce the gain thereof. For received signals of small amplitude the positive A.G.C. voltage applied through resistor 8 is not sufficient to block the diode 7, so this diode continues conducting and the first stage is not reduced in gain.

As the received signal strength increases a point is reached whereat the A.G.C. voltage is of sufficient value to prevent conduction of diode 7 and the base electrode of transistor 11 receives a reduced negative voltage. This produces a reduction of collector current in transistor 11 and a consequent decrease in the voltage drop across resistor 18 and a rise in the voltage of transistor 27. This increases the gain of transistor 27 and increases the value of the A.G.C. voltage. Amplified A.G.C. is in effect achieved and a small rise in received signal strength produces sufficient A.G.C. voltage to cut off collector current in transistor 11 which now acts as a capacitive coupling element and provides attenuation of the signal supplied to mixer 14.

The control of the gain of transistor 27, when transistor 11 is non-conductive, is of course normal automatic gain control operation.

Although PNP transistors are shown, it will be obvious that NPN types may be also applied to the invention. Further, more stages of amplification may be employed and the mixer circuit may also be eliminated when the invention is applied to a simple cascaded radio-frequency oscillation amplifier. Amplitude modulation of the radio frequency oscillation is not necessary to the operation of the invention which may be applied to other systems such as those which use frequency and pulse modulation or no modulation.

Although a preferred embodiment of my invention has been described, it will nevertheless be obvious, to those skilled in the art, that various variations of the invention may be made which do not depart from the spirit and scope thereof.

What is claimed is:

1. An automatic gain control system for a circuit of the type having first and second amplifier circuits, a source of signals, means applying said signals to said first amplifier circuit, means applying the output of said first amplifier circuit to said second amplifier circuit, a detector circuit and means applying the output of said second amplifier circuit to said detector circuit, whereby said detector circuit produces a direct automatic gain control voltage, said automatic gain control system comprising means for applying said direct voltage to said second amplifier circuit for decreasing the gain thereof as the amplitude of signals applied to said detector circuit increases, means for applying said direct voltage to said first amplifier circuit for decreasing the gain thereof only as the amplitude of signals applied to said detector circuit increases above a predetermined minimum amplitude, and means responsive to a decrease in gain of said first amplifier circuit for increasing the gain of said second amplifier circuit, said means responsive comprising direct current conductive means connected between said second amplifier circuit and a point in said first amplifier circuit having a potential dependent upon the gain thereof.

2. An automatic gain control system for a circuit of the type including a first transistor amplifier circuit having a first gain control terminal, a second amplifier circuit having a second gain control terminal, a source of signals connected to said first amplifier circuit, means applying the output of said first amplifier circuit to said second amplifier circuit, a detector circuit for producing a direct automatic gain control voltage, means for applying the output of said second amplifier circuit to said detector circuit, means for applying said control voltage to said first and second control terminals with a polarity to inversely vary the gains of said first and second amplifier circuits with respect to the amplitude of signals detected by said detector circuit, and delay means connected to said first amplifier circuit for preventing the reduction of gain of said first amplifier circuit when said control voltage is below a predetermined minimum value; wherein the improvement comprises direct current conductive means connected between said second gain control terminal and a point in said first amplifier circuit having a voltage that varies with gain whereby the gain of said second amplifier circuit is increased when the gain of said first amplifier circuit decreases as a result of increasing of said control voltage above said predetermined minimum value.

3. The gain control circuit of claim 2 comprising a source of operating potential having first and second terminals, wherein said first amplifier comprises a transistor having emitter, base and collector electrodes, output circuit means including first resistor means connected between said collector electrode and said first terminal whereby a voltage is developed across said resistance means that is dependent upon the gain of said first amplifier circuit, and said direct current conductive means comprises second resistor means connected to apply a portion of the voltage across said first resistor means to said second gain control terminal.

4. The gain control circuit of claim 3 in which said output circuit of said first amplifier circuit comprises a series circuit of a tuned output transformer and said first resistor means connected in that order between said collector electrode and said first terminal, and said second resistor means is connected between said second control terminal and the junction between said transformer and first resistor means.

5. The gain control circuit of claim 4 in which said second transistor amplifier comprises a second transistor having base, emitter and collector electrodes and being of the same conductivity type as said first mentioned transistor, and said first and second amplifiers comprise means for connecting said first and second terminals to the base electrodes of said first and second transistors respectively, and means for connecting the emitters of said first and second transistors to said second terminal of said source of operating potential.

6. The gain control circuit of claim 3 in which said first amplifier circuit comprises means for connecting said emitter electrode to said second terminal of said source of voltage, an input transformer winding having one end connected to said base electrode, and third resistor means connected between said first terminal of said source of voltage and the other end of said winding, and a series circuit of fourth and fifth resistor means having one end connected to said other end of said winding, said control voltage being applied to the other end of said series circuit, and said delay means comprises a diode connected between the junction of said fourth and fifth resistor means and said second terminal of said source of voltage, said diode being poled to conduct in the absence of said control voltage.

References Cited

UNITED STATES PATENTS

| | | | |
|---|---|---|---|
| 2,961,534 | 11/1960 | Scott | 325–410 X |
| 2,983,815 | 5/1961 | Guyton et al. | 330–29 X |
| 3,193,767 | 7/1965 | Schultz | 325–410 X |

FOREIGN PATENTS

| | | |
|---|---|---|
| 870,922 | 6/1961 | Great Britain. |

ROY LAKE, *Primary Examiner.*

N. KAUFMAN, J. B. MULLINS, *Assistant Examiners.*